US008354325B1

(12) United States Patent
Dao et al.

(10) Patent No.: US 8,354,325 B1
(45) Date of Patent: Jan. 15, 2013

(54) METHOD FOR FORMING A TOROIDAL INDUCTOR IN A SEMICONDUCTOR SUBSTRATE

(75) Inventors: Thuy B. Dao, Austin, TX (US); Qiang Li, Gilbert, AZ (US); Melvy F. Miller, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 21 days.

(21) Appl. No.: 13/171,989

(22) Filed: Jun. 29, 2011

(51) Int. Cl.
*H01L 21/8234* (2006.01)
(52) U.S. Cl. .............. 438/381; 438/238; 257/E21.022
(58) Field of Classification Search .............. 438/52, 438/138, 381, 238, 618, 613, 620, 622
See application file for complete search history.

(56) References Cited

U.S. PATENT DOCUMENTS

| 7,118,925 | B2 | 10/2006 | Brennan et al. | |
|---|---|---|---|---|
| 7,253,711 | B2 | 8/2007 | Pleskach et al. | |
| 7,264,986 | B2* | 9/2007 | Gogoi | 438/52 |
| 7,388,462 | B2 | 6/2008 | Ahn et al. | |
| 7,425,485 | B2* | 9/2008 | Gogoi | 438/238 |
| 7,501,924 | B2 | 3/2009 | Zhang | |
| 7,723,821 | B2* | 5/2010 | Gogoi | 257/531 |
| 7,868,729 | B2 | 1/2011 | Wang et al. | |
| 8,154,083 | B2* | 4/2012 | Park | 257/356 |
| 2007/0268105 | A1 | 11/2007 | Walls | |
| 2008/0252407 | A1 | 10/2008 | Anderson | |
| 2010/0024202 | A1 | 2/2010 | Maki et al. | |
| 2010/0327398 | A1* | 12/2010 | Levy et al. | 257/508 |

OTHER PUBLICATIONS

Huang, X. et al., "3D-Solenoid MEMS RF Inductor Design in Standard CMOS Technology", Electrical Engineering and Computer Sciences, College of Engineering, UC Berkeley, 4 pgs.
Ou, JY, et al., "Fabrication and Characterization of Microscaled On-Chip Toroidal Inductors", IEEE Transactions on Magnetics, vol. 45, No. 10, Oct. 2009, pp. 4767-4769.
Lee, SH, et al., "A Low-Voltage 2.4 GHz VCO with 3D Helical Inductors", IEEE Asia Pacific Conference on Circuits and Systems 2006, pp. 518-521.
Wu, C.H., et al., "Analysis and application of miniature 3D inductor", IEEE International Symposium on Circuits and Systems, 2002, vol. 2, pp. II.811-II.814.

* cited by examiner

*Primary Examiner* — Savitr Mulpuri
(74) *Attorney, Agent, or Firm* — Daniel D. Hill; Joanna G. Chiu

(57) ABSTRACT

A toroidal inductor formed in a semiconductor substrate. Through-silicon vias are used to connect metal layers formed on top and bottom surfaces of the semiconductor substrate. In one embodiment, the vias are elongated and laid out in two concentric circles, an inner circle enclosed by an outer circle. The vias of the outer concentric circle are longer than the vias of the inner circle so that spaces between vias are the same for both circles. In another embodiment, each elongated via may include a plurality of circular vias formed in a line. Metals layers on the top and bottom of the semiconductor substrate are patterned to form wedge shaped connectors between the inner and outer vias to form the spirals of the toroidal inductor. The wedge shaped connectors with elongated vias allow spacing between spirals to be constant.

20 Claims, 7 Drawing Sheets

METHOD FOR FORMING A TOROIDAL INDUCTOR IN A SEMICONDUCTOR SUBSTRATE

BACKGROUND

1. Field

This disclosure relates generally to inductors, and more specifically, to a method for forming a toroidal inductor in a semiconductor substrate.

2. Related Art

Inductors are commonly used in electronic circuits. In radio frequency (RF) circuits, inductors are needed that have a relatively high Q factor and high inductance values. Also, inductors implemented in the metal layers of an integrated circuit can cause significant interference due to the inductor magnetic field not being sufficiently confined.

Therefore, what is needed is an integrated circuit inductor that solves the above problems.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
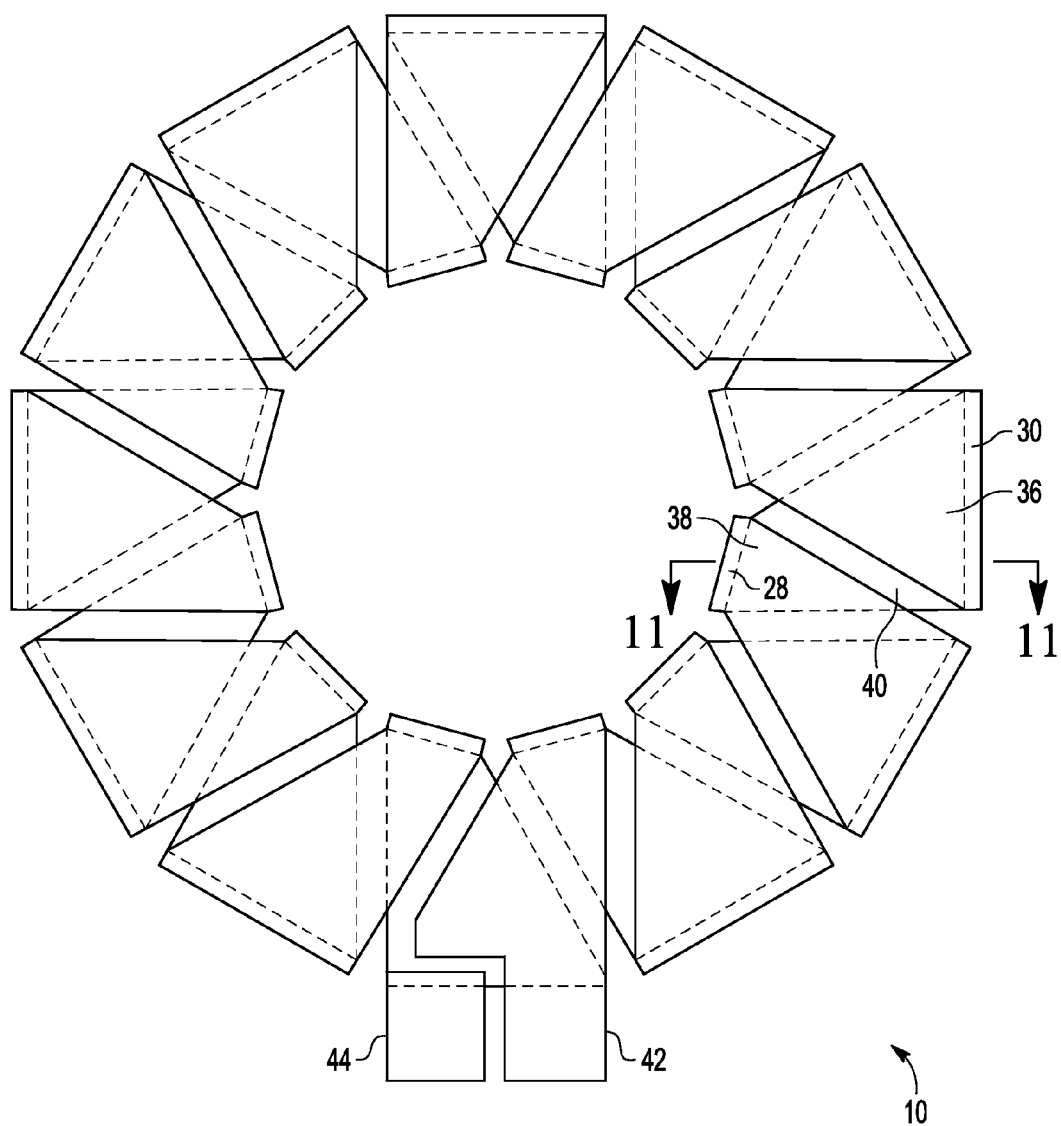
FIG. 1 illustrates a top down view of a toroidal inductor in accordance with an embodiment.

Generally, there is provided, a toroidal inductor formed in a semiconductor substrate. Through-silicon vias are used to connect metal layers formed on top and bottom surfaces of the semiconductor substrate. The vias are elongated and laid out in two concentric circles, an inner circle enclosed by an outer circle. The vias of the outer concentric circle are longer than the vias of the inner circle so that spaces between vias are the same for both circles. In another embodiment, each elongated via may be replaced by a plurality of circular vias formed in a line. Metals layers on the top and bottom of the semiconductor substrate are patterned to form wedge shaped connectors between the inner and outer vias to form the spirals of the toroidal inductor. The wedge shaped connectors allow spacing between spirals to be constant.

Forming the inductor in a semiconductor substrate provides better confinement for the magnetic field than an inductor formed in a dielectric layer of a semiconductor device. Also, using constant spacing between the spirals provides an inductor with a higher Q factor.

In one aspect, there is provided, a method for forming a toroidal inductor, the method comprising: forming a first plurality of conductive vias in a top surface of a semiconductor layer and a second plurality of conductive vias in the top surface of the semiconductor layer, wherein the first plurality of conductive vias is formed in a first circular pattern in the semiconductor layer and the second plurality of conductive vias is formed in a second circular pattern in the semiconductor layer, wherein the second circular pattern surrounds the first circular pattern, and wherein each of the first and second plurality of conductive vias extend into the semiconductor layer from the top surface towards a bottom surface of the semiconductor layer, opposite the top surface, and wherein each of the second plurality of conductive vias has a length along the top surface of the semiconductor layer that is longer than a length of each of the first plurality of conductive vias along the top surface of the semiconductor layer; forming a first patterned conductive layer over the top surface of the semiconductor layer and over the first and second plurality of conductive vias, wherein the first patterned conductive layer has a first plurality of conductive portions, each conductive portion of the first plurality of conductive portions being in contact with a corresponding conductive via of the first plurality of conductive vias and a corresponding conductive via of the second plurality of conductive vias; removing a portion of the semiconductor layer from the bottom surface of the semiconductor layer to expose each of the first and second plurality of conductive vias at the bottom surface of the semiconductor layer; and forming a second patterned conductive layer over the bottom surface of the semiconductor layer and over the first and second plurality of conductive vias at the bottom surface of the semiconductor layer, wherein the semiconductor layer and the first and second plurality of conductive vias are between the first patterned conductive layer and the second patterned conductive layer, wherein the second patterned conductive layer has a second plurality of conductive portions, each conductive portion of the second plurality of conductive portions being in contact with a corresponding conductive via of the first plurality of conductive vias and a corresponding conductive via of the second plurality of conductive vias, wherein the first patterned conductive layer, the first plurality of conductive vias, the second plurality of conductive vias, and the second patterned conductive layer form a toroidal inductor coil. Forming the first plurality of conductive vias and the second plurality of conductive vias may be performed such that the second circular pattern surrounds at least 90% of the first circular pattern. Forming the first plurality of conductive vias and the second plurality of conductive vias may be performed such that the first circular pattern is concentric to the second circular pattern. Forming the first plurality of conductive vias and the second plurality of conductive vias may comprise: forming a first plurality of openings for the first plurality of conductive vias and a second plurality of openings for the second plurality of conductive vias; and at least partially filling each of the first plurality of openings and each of the second plurality of openings with a conductive material. Forming the first plurality of conductive vias and the second plurality of conductive vias may further comprise, prior to the at least partially filling, forming a liner layer in each of the first plurality of openings and each of the second plurality of openings. The method may further comprise forming a dielectric layer over the top surface of the semiconductor layer, wherein each of the first plurality of conductive vias and the second plurality of conductive vias are formed such that they extend through the dielectric layer into the top surface of the semiconductor layer, and wherein the first patterned conductive layer is formed over the dielectric layer. After forming the first plurality of conductive vias and the second plurality of conductive vias and prior to forming the first patterned conductive layer, the method may further comprise forming a contact to a transistor in and on top of the semiconductor layer. The first patterned conductive layer may be formed such that a separate conductive portion of the first patterned conductive layer is formed over and in contact with the contact to the transistor. The first plurality of conductive vias and the second plurality of conductive vias may be formed such that a distance between immediately adjacent conductive vias of the first plurality of conductive vias and a distance between immediately adjacent conductive vias of the second plurality of conductive vias have a same value. The first plurality of conductive vias and the second plurality of conductive vias may be formed such that immediately adjacent edges of immediately adjacent conductive portions of the first patterned conductive layer are parallel to each other. Each of the first plurality and the second plurality of conductive vias may comprise a different conductive material than the first patterned conductive layer.

In another aspect, there is provided, a method for forming a toroidal inductor, the method comprising: forming a dielectric layer over a top surface of a semiconductor layer; forming a first plurality of conductive vias in the dielectric layer and extending into the top surface of the semiconductor layer and a second plurality of conductive vias in the dielectric layer and extending into the top surface of the semiconductor layer, wherein the first plurality of conductive vias is formed in a first circular pattern in the semiconductor layer and the second plurality of conductive vias is formed in a second circular pattern in the semiconductor layer, wherein the first circular pattern is concentric to the second circular pattern, and wherein each of the first and second plurality of conductive vias extend into the semiconductor layer from the top surface towards a bottom surface of the semiconductor layer, opposite the top surface, and wherein each of the second plurality of conductive vias has a length along the top surface of the semiconductor layer that is longer than a length of each of the first plurality of conductive vias along the top surface of the semiconductor layer; forming a first patterned conductive layer over the dielectric layer and over the first and second plurality of conductive vias, wherein the first patterned conductive layer has a first plurality of conductive portions, each conductive portion of the first plurality of conductive portions being in contact with one conductive via of the first plurality of conductive vias and one conductive via of the second plurality of conductive vias; removing a portion of the semiconductor layer from the bottom surface of the semiconductor layer to expose each of the first and second plurality of conductive vias at the bottom surface of the semiconductor layer; and forming a second patterned conductive layer over the bottom surface of the semiconductor layer and over the first and second plurality of conductive vias at the bottom surface of the semiconductor layer, wherein the semiconductor layer and the first and second plurality of conductive vias are between the first patterned conductive layer and the second patterned conductive layer, wherein the second patterned conductive layer has a second plurality of conductive portions, each conductive portion of the second plurality of conductive portions being in contact with a corresponding conductive via of the first plurality of conductive vias and a corresponding conductive via of the second plurality of conductive vias, wherein each conductive via of the first plurality of conductive vias and each conductive via of the second plurality of conductive vias is in contact with one conductive portion of the first plurality of conductive portions and one conductive portion of the second plurality of conductive portions, such that the first patterned conductive layer, the first plurality of conductive vias, the second plurality of conductive vias, and the second patterned conductive layer form a toroidal inductor coil. The step of forming the first plurality of conductive vias and the second plurality of conductive vias may comprise: forming a first plurality of openings in the dielectric layer and the semiconductor layer for the first plurality of conductive vias and a second plurality of openings in the dielectric layer and the semiconductor layer for the second plurality of conductive vias; and at least partially filling each of the first plurality of openings and each of the second plurality of openings with a conductive material. The step of forming the first plurality of conductive vias and the second plurality of conductive vias may further comprise, prior to the at least partially filling, forming a liner layer in each of the first plurality of openings and each of the second plurality of openings. Prior to forming the dielectric layer, the method may further comprise forming a transistor in and on the top surface of the semiconductor layer, wherein the dielectric layer is formed over the transistor; and after the forming the first and second plurality of conductive vias, the method further comprises forming a contact to the transistor. The first patterned conductive layer may be formed such that a separate conductive portion of the first patterned conductive layer is formed over and in contact with the contact to the transistor. A distance between immediately adjacent conductive vias of the first plurality of conductive vias and a distance between immediately adjacent conductive vias of the second plurality of conductive vias may have a same value. Immediately adjacent edges of immediately adjacent conductive portions of the first patterned conductive layer may be parallel to each other.

In yet another aspect, there is provided, a method for forming a toroidal inductor, the method comprising: forming a first plurality of conductive vias in a top surface of a semiconductor layer and a second plurality of conductive vias in the top surface of the semiconductor layer, wherein the first plurality of conductive vias is formed in a first circular pattern in the semiconductor layer and the second plurality of conductive vias is formed in a second circular pattern in the semiconductor layer, wherein the second circular pattern surrounds the first circular pattern, and wherein each of the first and second plurality of conductive vias extend into the semiconductor layer from the top surface towards a bottom surface of the semiconductor layer, opposite the top surface, forming a first patterned conductive layer over the top surface of the semiconductor layer and over the first and second plurality of conductive vias, wherein the first patterned conductive layer has a first plurality of conductive portions, each conductive portion of the first plurality of conductive portions being in contact with a corresponding conductive via of the first plurality of conductive vias and a corresponding conductive via of the second plurality of conductive vias, wherein immediately adjacent edges of immediately adjacent conductive portions of the first patterned conductive layer are parallel to each other; grinding the bottom surface of the semiconductor layer to expose each of the first and second plurality of conductive vias; and forming a second patterned conductive layer over the bottom surface of the semiconductor layer and over the first and second plurality of conductive vias at the bottom surface of the semiconductor layer, wherein the semiconductor layer and the first and second plurality of conductive vias are between the first patterned conductive layer and the second patterned conductive layer, wherein the second patterned conductive layer has a second plurality of conductive portions, each conductive portion of the second plurality of conductive portions being in contact with a corresponding conductive via of the first plurality of conductive vias and a corresponding conductive via of the second plurality of conductive vias, wherein immediately adjacent edges of immediately adjacent conductive portions of the second patterned conductive layer are parallel to each other, and wherein the first patterned conductive layer, the first plurality of conductive vias, the second plurality of conductive vias, and the second patterned conductive layer form a toroidal inductor coil. The second circular pattern may surround at least 90% of the first circular pattern.

The semiconductor substrate described herein can be any semiconductor material or combinations of materials, such as gallium arsenide, silicon germanium, silicon-on-insulator (SOI), silicon, monocrystalline silicon, the like, and combinations of the above. Also, the semiconductor substrate can have a high resistivity or a low resistivity, either by selection or by doping concentration.

As used herein the term metal-oxide-semiconductor and the abbreviation MOS are to be interpreted broadly, in particular, it should be understood that they are not limited merely to structures that use "metal" and "oxide" but may employ any type of conductor including "metal" and any type of dielectric including "oxide". The term field effect transistor is abbreviated as "FET".

FIG. 1 illustrates a top down view of toroidal inductor 10 in accordance with an embodiment. Toroidal inductor 10 is formed with a metal layer on a top side of a semiconductor substrate and with another metal layer on a bottom, or back side of the semiconductor substrate. The top side metal layer may be a first metal layer, or lowest metal layer on the top surface of the semiconductor substrate. In another embodiment, the top side metal layer may be another layer besides the first metal layer. In one embodiment, the metal layers may comprise copper. In another embodiment, the metal layers may comprise aluminum. In yet another embodiment, the integrated circuit may comprise copper layers and aluminum layers. The semiconductor substrate is not illustrated in FIG. 1. Two pluralities of vias are formed through the semiconductor substrate. The two pluralities of vias are formed in two concentric circles. One of the pluralities of vias forms an inner circle and the other pluralities of vias forms an outer circle. The outer circle is larger than the inner circle. The vias are filled, or partially filled, with a conductive material as described below. Forming the first plurality of conductive vias and the second plurality of conductive vias may be performed such that the second circular pattern surrounds at least 90% of the first circular pattern.

Figure 12:
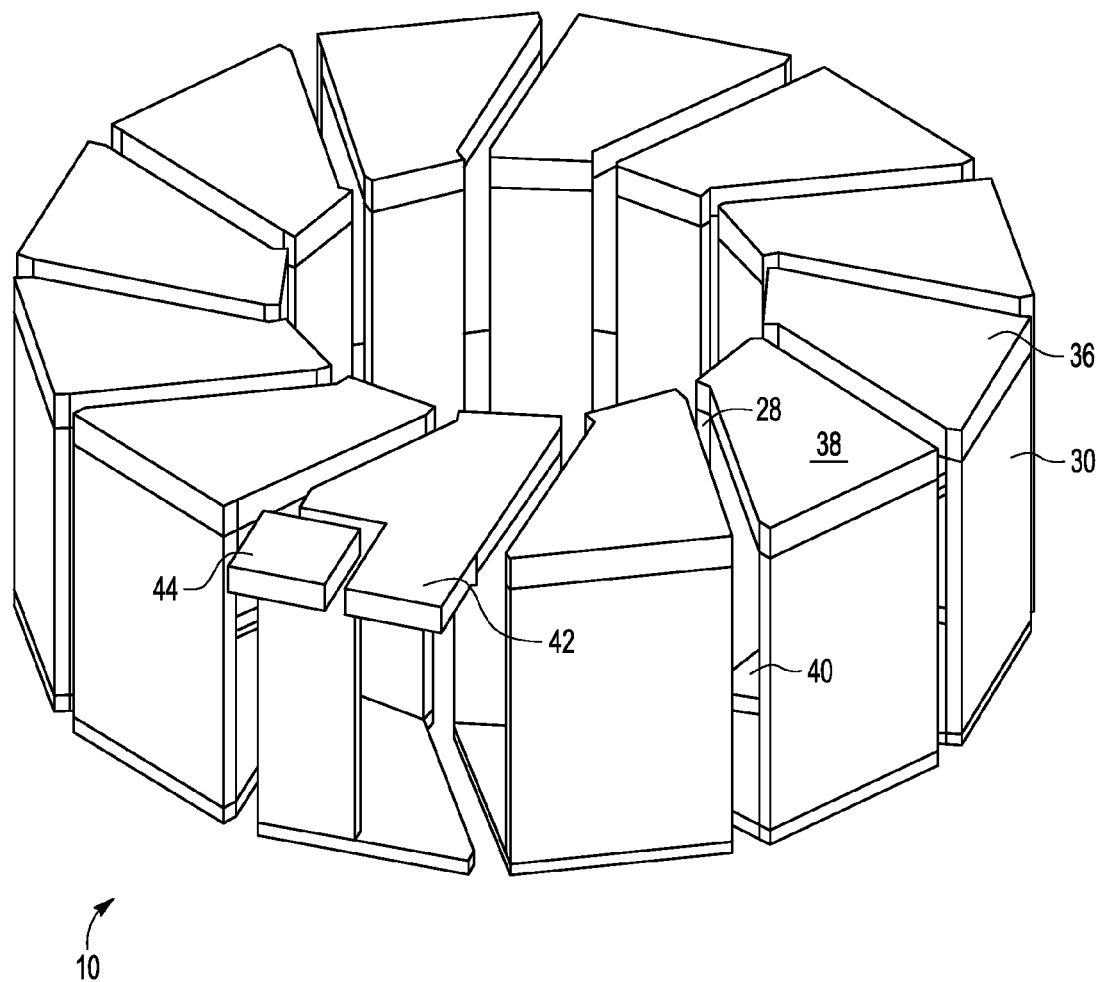
FIG. 12 illustrates a perspective view of the toroidal inductor illustrated in FIG. 1.

Each of the vias is elongated, with the vias of the outer circle being longer than the vias of the inner circle so that a space between each of the vias is the same for both the inner and outer circles. The first plurality of conductive vias and the second plurality of conductive vias may be formed such that immediately adjacent edges of immediately adjacent conductive portions of the first patterned conductive layer are parallel to each other. The two metal layers are patterned in wedge shapes to form a plurality of portions in a circular configuration. For example, wedge shaped conductive portions 36 and 38 are two of a plurality of wedge shaped conductor portions on the top surface of the semiconductor substrate as illustrated in FIG. 1. A wedge shaped conductive portion 40 is formed in the bottom surface of the semiconductor substrate. The portions 36 and 38 in the top layer are formed over the portion 40 of the bottom layer. The two layers of conductive portions are connected using the concentric circles of through-silicon vias. The wedge shaped portions are shaped and patterned so that a space between each of the portions has the same dimension. The bottom conductive layer is patterned similarly so that a spiral conductor is formed through the semiconductor substrate using the top and bottom patterned layers and the vias. As illustrated, via 30 is one via of the plurality of vias that make up the outer circle and via 28 is one via of the plurality of vias that makes up the inner circle. Via 28 connects top portion 36 to bottom portion 40. Via 30 connects top portion 36 to bottom portion 40. The conductive vias of the outer and inner circles may comprise the same type of conductive material or a different type of conductive material than the conductive portions. A conductor is formed by the combination of vias and conductive portions that spirals in a circle to form the toroidal shape. A perspective view of toroidal inductor 10 is illustrated in FIG. 12. In one embodiment, the conductive layers comprise a metal such as copper or aluminum. Pads 42 and 44 are formed at the ends of the inductor for electrical connection. As can be seen in FIG. 1, a space between each of the wedge shaped conductive portions has the same width. In another embodiment, each elongated via may be replaced with a plurality of smaller vias.

Figure 2:
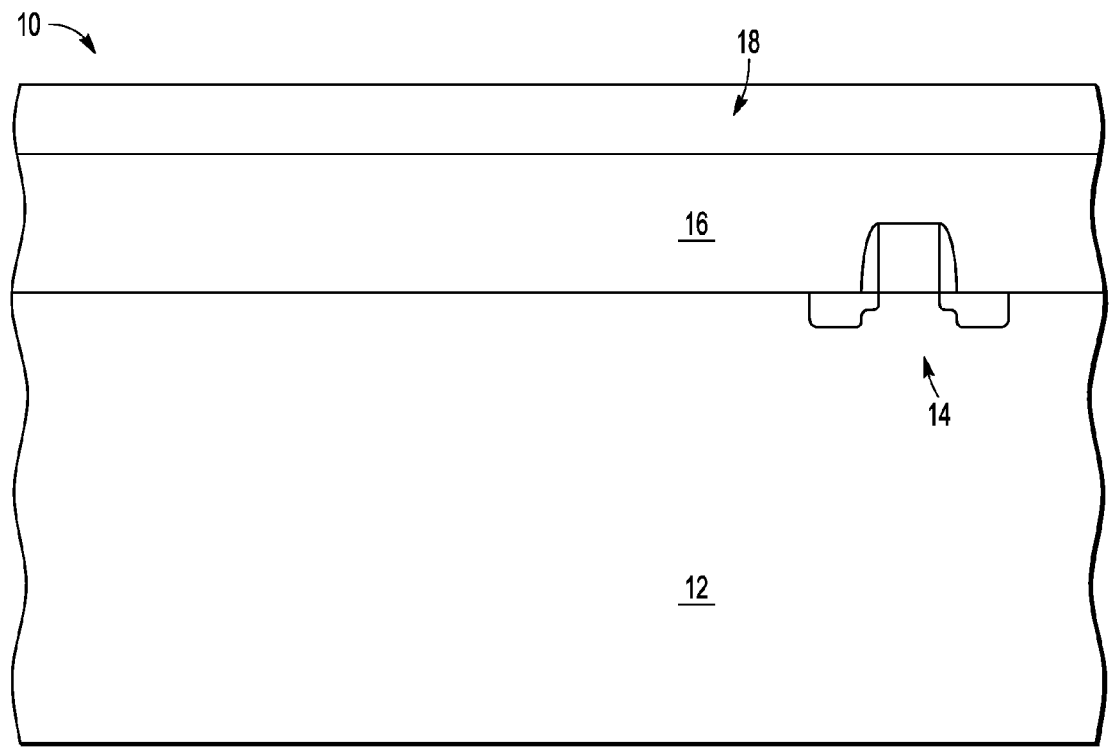
FIGS. 2-11 illustrate cross-sectional views of the toroidal inductor of FIG. 1 in accordance with a method for making the toroidal inductor.

FIGS. 2-11 illustrate cross-sectional views of the toroidal inductor of FIG. 1 in accordance with a method for making toroidal inductor 10. FIG. 2 illustrates a cross-sectional view of toroidal inductor 10 along a line 11-11 of FIG. 1 during a step for making the toroidal inductor. In one embodiment, toroidal inductor 10 is formed in semiconductor substrate 12 with active or passive circuitry, such as for example, a transistor 14. Transistor 14 may be any type of transistor formed with any type of process. For example, transistor 14 may be an N-channel transistor formed using a conventional complementary metal-oxide semiconductor (CMOS) process. In another embodiment, toroidal inductor 10 may be formed on semiconductor substrate 12 with one or more other devices including a MOS transistor, bipolar transistor, diode, resistor, capacitor, MEMS (micro electromechanical system) device, or other type of device or combination of devices. The device may include one or more volatile or non-volatile memory cells. In another embodiment, substrate 12 is an silicon-on-insulator (SOI) substrate.

Dielectric layer 16 is formed over substrate 12 and transistor 14. In one embodiment, dielectric layer 16 is an interlevel dielectric (ILD) layer. A masking layer 18, such as for example, a conventional hard mask, is formed over ILD layer 16.

Figure 3:
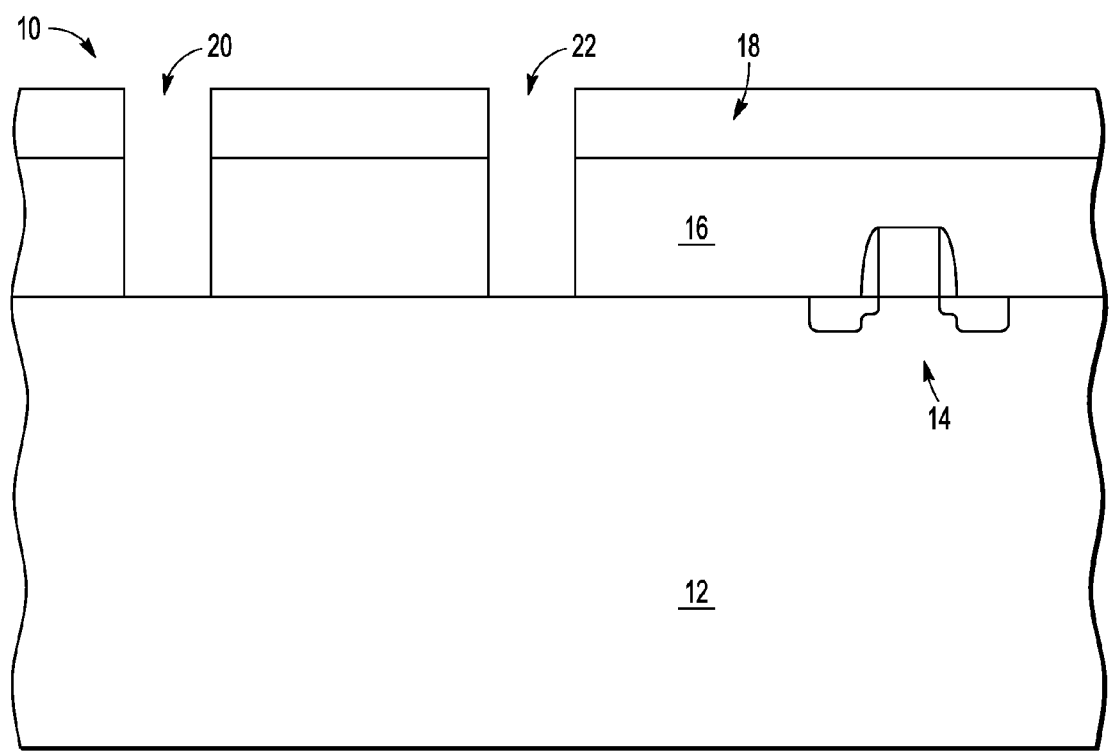

FIG. 3 illustrates a cross-sectional view of toroidal inductor 10 during a subsequent stage of manufacture. In FIG. 3, a mask (not shown) is provided to pattern hard mask 18 and dielectric layer 16 to form openings 20 and 22 for the through silicon vias of inductor 10.

Figure 4:
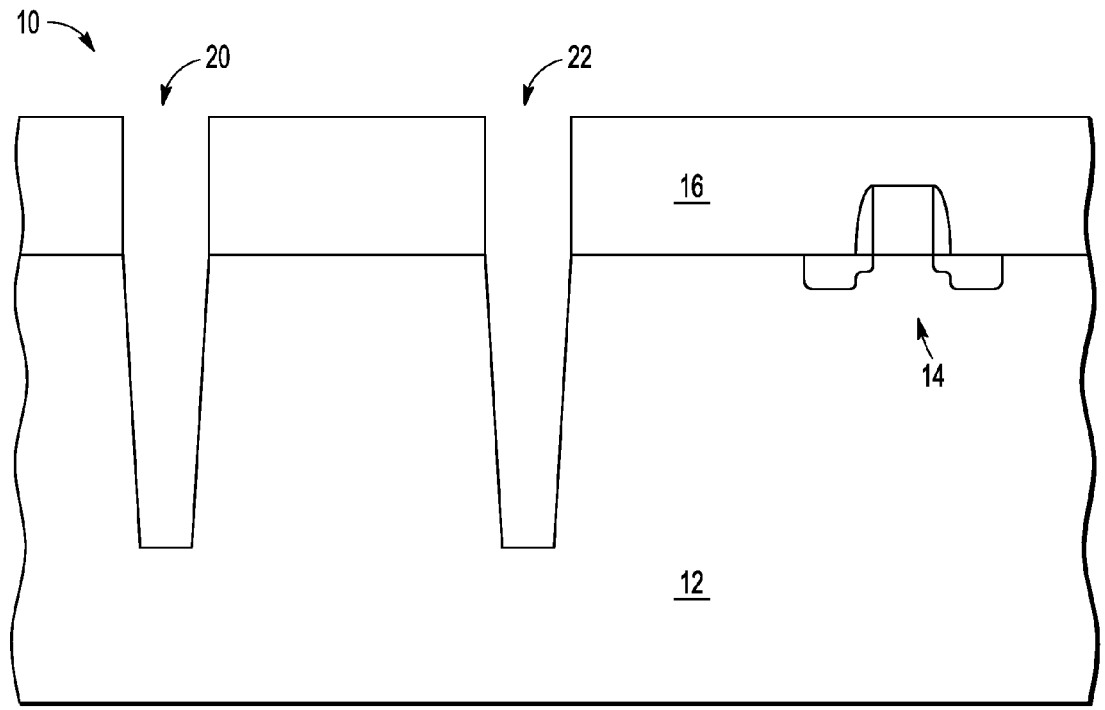

FIG. 4 illustrates a cross-sectional view of toroidal inductor 10 at a subsequent stage of the method for forming. Substrate 12 is etched using a conventional silicon etch process to form vias in substrate 12 through openings 20 and 22. Hard mask layer 18 is consumed during the etching process.

Figure 5:
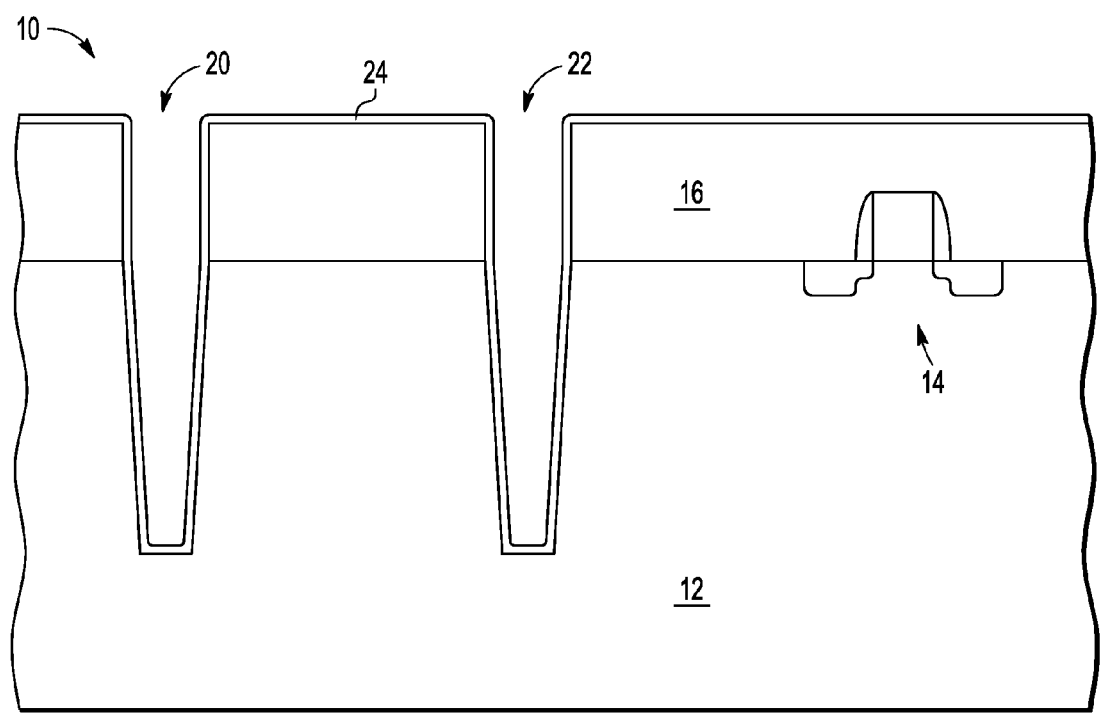

FIG. 5 illustrates a cross-sectional view of toroidal inductor 10 after liner layer 24 is formed over dielectric layer 16 and on the sidewalls of vias 20 and 22. Liner layer 24 can be an insulating layer or a barrier layer and comprise, for example, an oxide, titanium, or titanium nitride. In an embodiment, a seed layer may be included.

Figure 6:
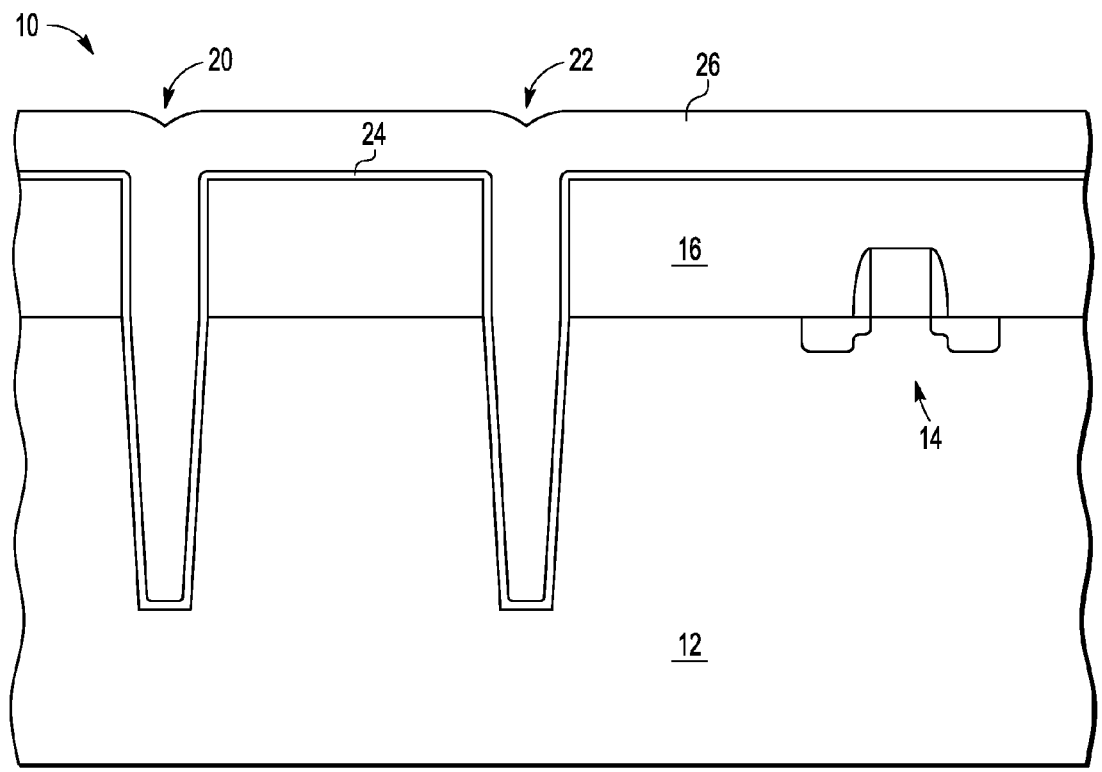

FIG. 6 illustrates a cross-sectional view of toroidal inductor 10 after a metal layer 26 is formed over liner layer 24 filling vias 20 and 22. Metal layer 26 may comprise copper or aluminum or another conductive material.

Figure 7:
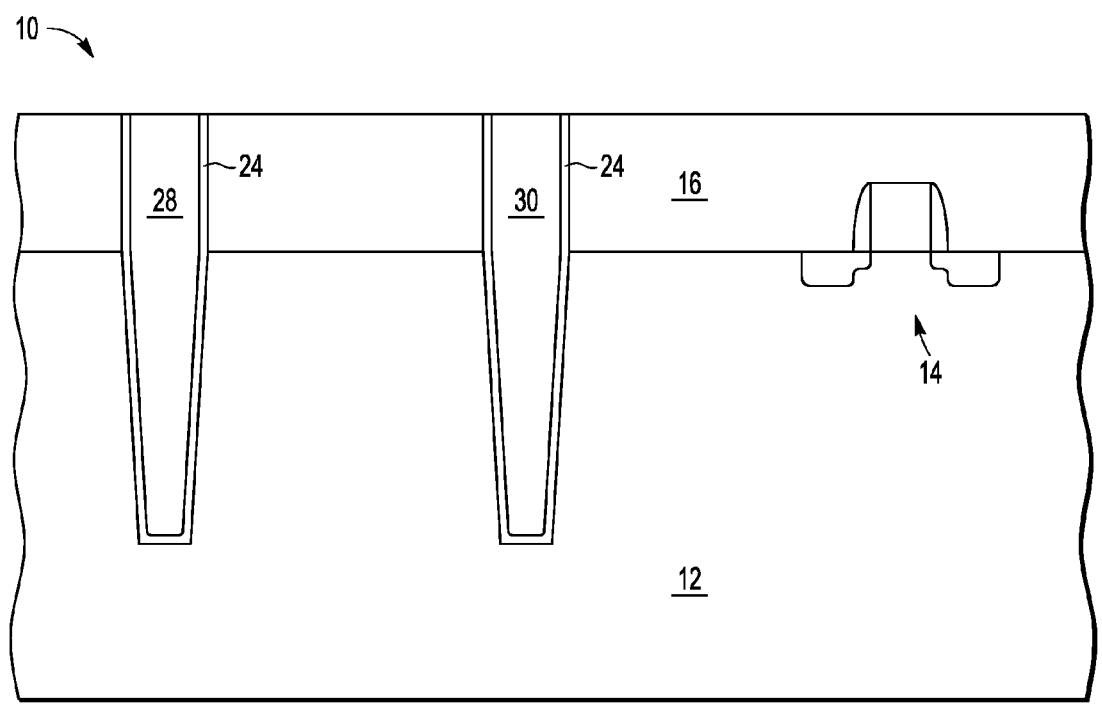

FIG. 7 illustrates a cross-sectional view of toroidal inductor 10 after metal layer 26 is planarized down to dielectric layer 16. In one embodiment, metal layer 26 may be planarized using a conventional chemical mechanical polishing (CMP) process.

Figure 8:
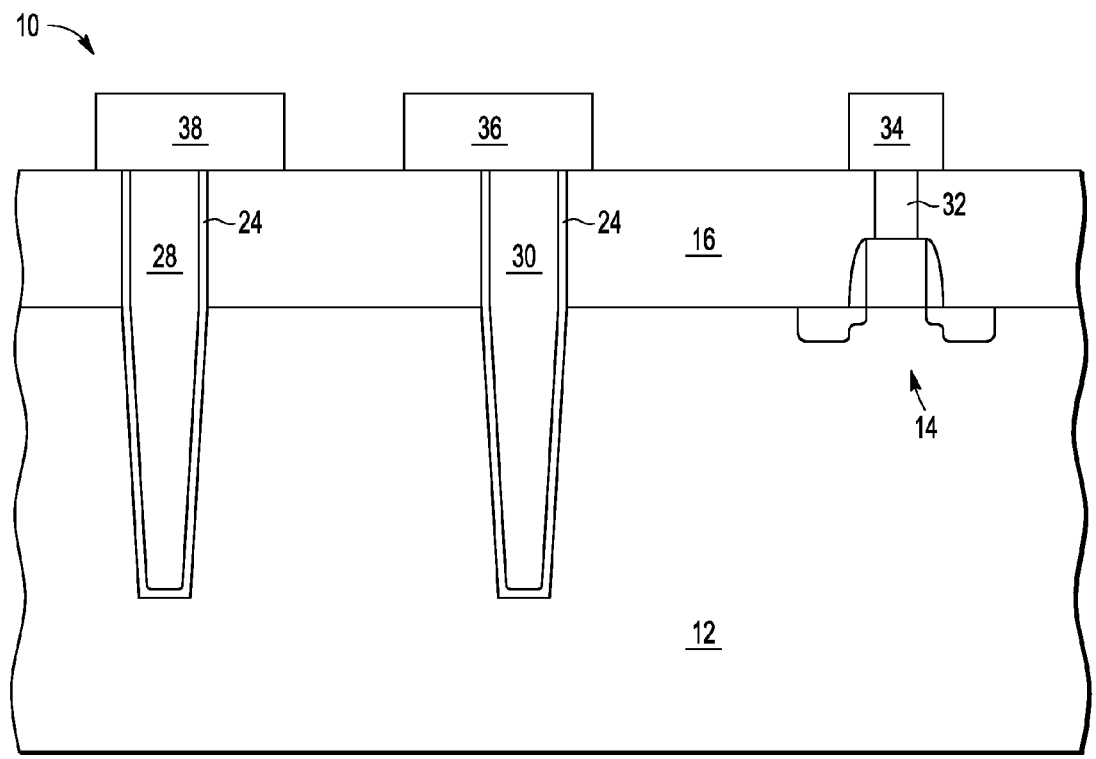

FIG. 8 illustrates a cross-sectional view of toroidal inductor 10 after vias for connecting the circuitry are formed, such as for example via 32 formed to electrically connect transistor 14. Also, a metal layer is formed over substrate 12 to form conductive portions 36 and 38 of inductor 10 illustrated in FIG. 1. The metal layer is also used to form other contacts and conductors, such as a conductor 34 connected to contact 32. In addition, other ILD layers and metal layers are formed as needed.

Figure 9:
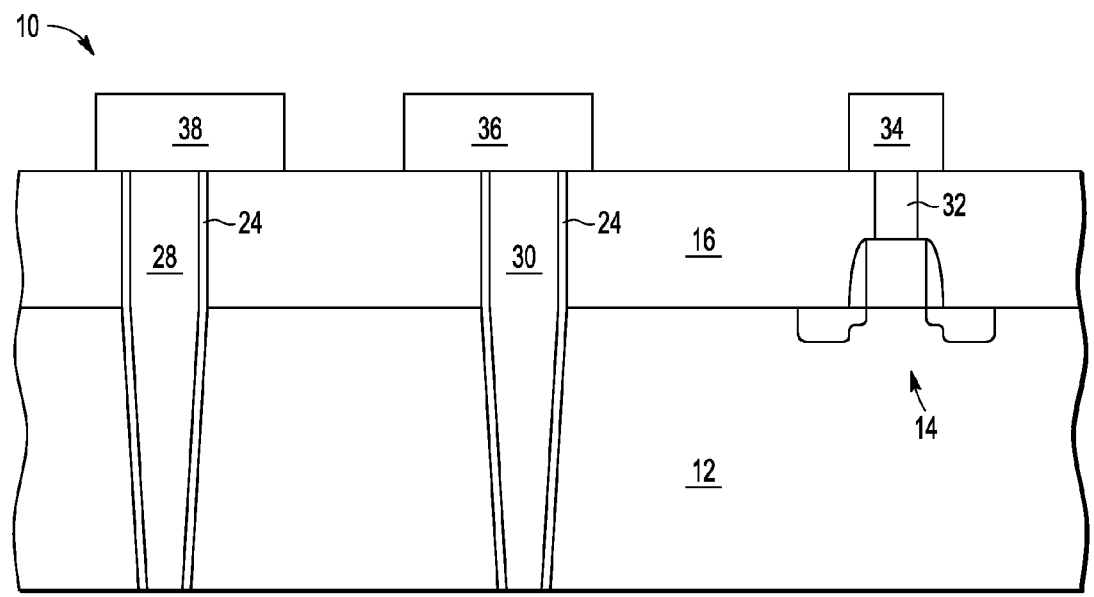

FIG. 9 illustrates a cross-sectional view of toroidal inductor 10 after a bottom portion of semiconductor substrate 12 is ground to expose the bottom ends of vias 28 and 30. In one embodiment, semiconductor substrate 12 is ground using a conventional CMP process.

Figure 10:
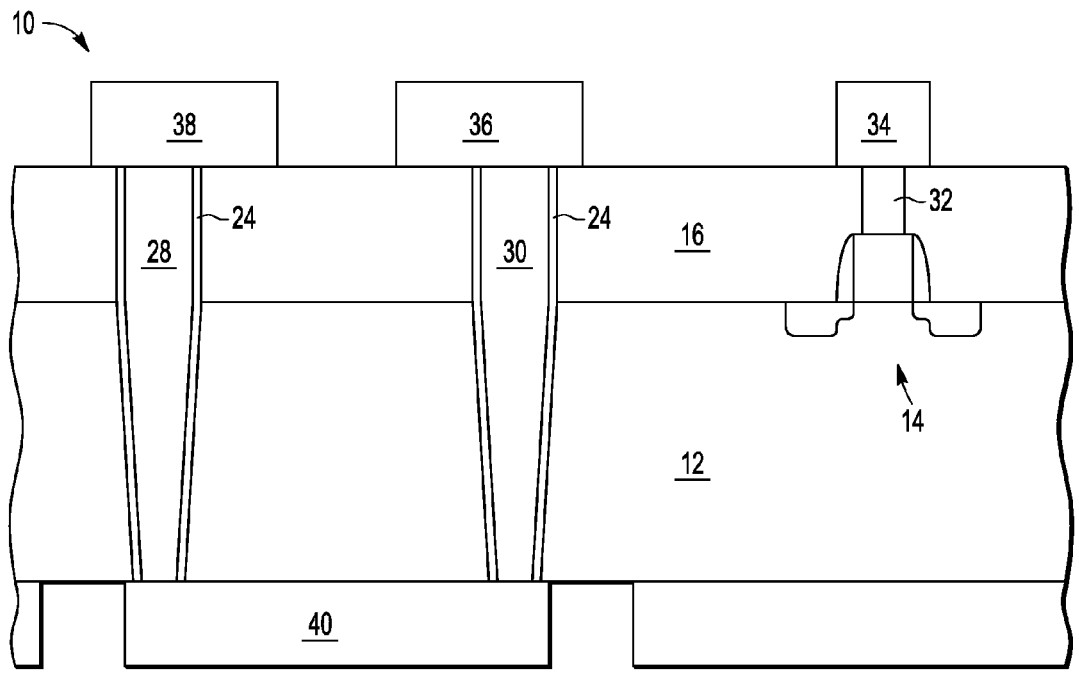

FIG. 10 illustrates a cross-sectional view of toroidal inductor 10 after a backside metal layer is formed on the bottom of semiconductor substrate 12. The backside metal is patterned to form conductive portion 40 as illustrated in FIG. 1. The backside metal may include copper, aluminum, or another type of conductive material.

Figure 11:
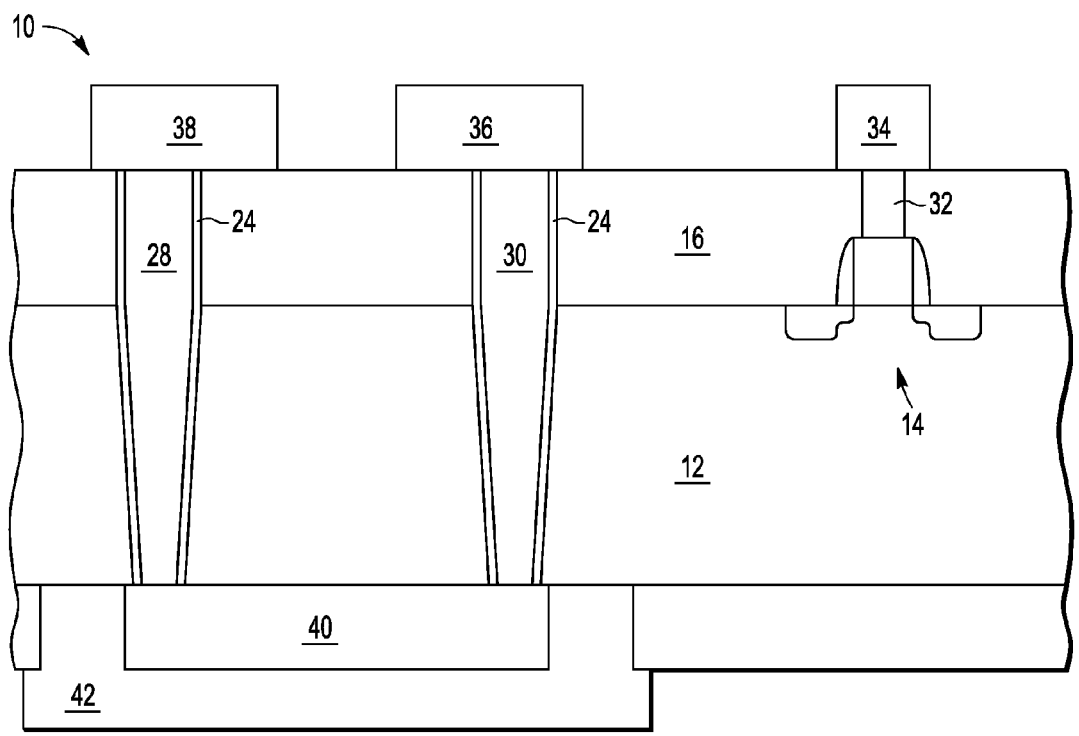

FIG. 11 illustrates a cross-sectional view of toroidal inductor 10 after a dielectric layer 42 is formed over backside metal layer including conductive portion 40. Additional backend processes are then completed.

FIG. 12 illustrates a perspective view of the toroidal inductor illustrated in FIG. 1.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for forming a toroidal inductor, the method comprising:

forming a first plurality of conductive vias in a top surface of a semiconductor layer and a second plurality of conductive vias in the top surface of the semiconductor layer, wherein the first plurality of conductive vias is formed in a first circular pattern in the semiconductor layer and the second plurality of conductive vias is formed in a second circular pattern in the semiconductor layer, wherein the second circular pattern surrounds the first circular pattern, and wherein each of the first and second plurality of conductive vias extend into the semiconductor layer from the top surface towards a bottom surface of the semiconductor layer, opposite the top surface, and wherein each of the second plurality of conductive vias has a length along the top surface of the semiconductor layer that is longer than a length of each of the first plurality of conductive vias along the top surface of the semiconductor layer;

forming a first patterned conductive layer over the top surface of the semiconductor layer and over the first and second plurality of conductive vias, wherein the first patterned conductive layer has a first plurality of conductive portions, each conductive portion of the first plurality of conductive portions being in contact with a corresponding conductive via of the first plurality of conductive vias and a corresponding conductive via of the second plurality of conductive vias;

removing a portion of the semiconductor layer from the bottom surface of the semiconductor layer to expose each of the first and second plurality of conductive vias at the bottom surface of the semiconductor layer; and forming a second patterned conductive layer over the bottom surface of the semiconductor layer and over the first and second plurality of conductive vias at the bottom surface of the semiconductor layer, wherein the semiconductor layer and the first and second plurality of conductive vias are between the first patterned conductive layer and the second patterned conductive layer, wherein the second patterned conductive layer has a second plurality of conductive portions, each conductive portion of the second plurality of conductive portions being in contact with a corresponding conductive via of the first plurality of conductive vias and a corresponding conductive via of the second plurality of conductive vias, wherein the first patterned conductive layer, the first plurality of conductive vias, the second plurality of conductive vias, and the second patterned conductive layer form a toroidal inductor coil.

2. The method of claim 1, wherein the forming the first plurality of conductive vias and the second plurality of conductive vias is performed such that the second circular pattern surrounds at least 90% of the first circular pattern.

3. The method of claim 2, wherein the forming the first plurality of conductive vias and the second plurality of conductive vias is performed such that the first circular pattern is concentric to the second circular pattern.

4. The method of claim 1, wherein the forming the first plurality of conductive vias and the second plurality of conductive vias comprises:

forming a first plurality of openings for the first plurality of conductive vias and a second plurality of openings for the second plurality of conductive vias; and at least partially filling each of the first plurality of openings and each of the second plurality of openings with a conductive material.

5. The method of claim 4, wherein the forming the first plurality of conductive vias and the second plurality of conductive vias further comprises:

prior to the at least partially filling, forming a liner layer in each of the first plurality of openings and each of the second plurality of openings.

6. The method of claim 1, further comprising:

forming a dielectric layer over the top surface of the semiconductor layer, wherein each of the first plurality of conductive vias and the second plurality of conductive vias are formed such that they extend through the dielectric layer into the top surface of the semiconductor layer, and wherein the first patterned conductive layer is formed over the dielectric layer.

7. The method of claim 1, wherein after the forming the first plurality of conductive vias and the second plurality of conductive vias and prior to the forming the first patterned conductive layer, the method further comprises:
   forming a contact to a transistor formed in and on the top surface of the semiconductor layer.

8. The method of claim 7, wherein the first patterned conductive layer is formed such that a separate conductive portion of the first patterned conductive layer is formed over and in contact with the contact to the transistor.

9. The method of claim 1, wherein the forming the first plurality of conductive vias and the second plurality of conductive vias is performed such that a distance between immediately adjacent conductive vias of the first plurality of conductive vias and a distance between immediately adjacent conductive vias of the second plurality of conductive vias have a same value.

10. The method of claim 1, wherein the forming the first plurality of conductive vias and the second plurality of conductive vias is performed such that immediately adjacent edges of immediately adjacent conductive portions of the first patterned conductive layer are parallel to each other.

11. The method of claim 1, wherein each of the first plurality and the second plurality of conductive vias comprises a different conductive material than the first patterned conductive layer.

12. A method for forming a toroidal inductor, the method comprising:
   forming a dielectric layer over a top surface of a semiconductor layer;
   forming a first plurality of conductive vias in the dielectric layer and extending into the top surface of the semiconductor layer and a second plurality of conductive vias in the dielectric layer and extending into the top surface of the semiconductor layer, wherein the first plurality of conductive vias is formed in a first circular pattern in the semiconductor layer and the second plurality of conductive vias is formed in a second circular pattern in the semiconductor layer, wherein the first circular pattern is concentric to the second circular pattern, and wherein each of the first and second plurality of conductive vias extend into the semiconductor layer from the top surface towards a bottom surface of the semiconductor layer, opposite the top surface, and wherein each of the second plurality of conductive vias has a length along the top surface of the semiconductor layer that is longer than a length of each of the first plurality of conductive vias along the top surface of the semiconductor layer;
   forming a first patterned conductive layer over the dielectric layer and over the first and second plurality of conductive vias, wherein the first patterned conductive layer has a first plurality of conductive portions, each conductive portion of the first plurality of conductive portions being in contact with one conductive via of the first plurality of conductive vias and one conductive via of the second plurality of conductive vias;
   removing a portion of the semiconductor layer from the bottom surface of the semiconductor layer to expose each of the first and second plurality of conductive vias at the bottom surface of the semiconductor layer; and
   forming a second patterned conductive layer over the bottom surface of the semiconductor layer and over the first and second plurality of conductive vias at the bottom surface of the semiconductor layer, wherein the semiconductor layer and the first and second plurality of conductive vias are between the first patterned conductive layer and the second patterned conductive layer, wherein the second patterned conductive layer has a second plurality of conductive portions, each conductive portion of the second plurality of conductive portions being in contact with a corresponding conductive via of the first plurality of conductive vias and a corresponding conductive via of the second plurality of conductive vias, wherein each conductive via of the first plurality of conductive vias and each conductive via of the second plurality of conductive vias is in contact with one conductive portion of the first plurality of conductive portions and one conductive portion of the second plurality of conductive portions, such that the first patterned conductive layer, the first plurality of conductive vias, the second plurality of conductive vias, and the second patterned conductive layer form a toroidal inductor coil.

13. The method of claim 12, wherein the forming the first plurality of conductive vias and the second plurality of conductive vias comprises:
   forming a first plurality of openings in the dielectric layer and the semiconductor layer for the first plurality of conductive vias and a second plurality of openings in the dielectric layer and the semiconductor layer for the second plurality of conductive vias; and
   at least partially filling each of the first plurality of openings and each of the second plurality of openings with a conductive material.

14. The method of claim 13, wherein the forming the first plurality of conductive vias and the second plurality of conductive vias further comprises:
   prior to the at least partially filling, forming a liner layer in each of the first plurality of openings and each of the second plurality of openings.

15. The method of claim 12, wherein:
   prior to the forming the dielectric layer, the method further comprises forming a transistor in and on the top surface of the semiconductor layer, wherein the dielectric layer is formed over the transistor; and
   after the forming the first and second plurality of conductive vias, the method further comprises forming a contact to the transistor.

16. The method of claim 15, wherein the first patterned conductive layer is formed such that a separate conductive portion of the first patterned conductive layer is formed over and in contact with the contact to the transistor.

17. The method of claim 12, wherein the forming the first plurality of conductive vias and the second plurality of conductive vias is performed such that a distance between immediately adjacent conductive vias of the first plurality of conductive vias and a distance between immediately adjacent conductive vias of the second plurality of conductive vias have a same value.

18. The method of claim 12, wherein the forming the first plurality of conductive vias and the second plurality of conductive vias is performed such that immediately adjacent edges of immediately adjacent conductive portions of the first patterned conductive layer are parallel to each other.

19. A method for forming a toroidal inductor, the method comprising:
   forming a first plurality of conductive vias in a top surface of a semiconductor layer and a second plurality of conductive vias in the top surface of the semiconductor layer, wherein the first plurality of conductive vias is formed in a first circular pattern in the semiconductor layer and the second plurality of conductive vias is formed in a second circular pattern in the semiconductor layer, wherein the second circular pattern surrounds the first circular pattern, and wherein each of the first and second plurality of conductive vias extend into the semiconductor layer from the top surface towards a bottom surface of the semiconductor layer, opposite the top surface, forming a first patterned conductive layer over the top surface of the semiconductor layer and over the first and second plurality of conductive vias, wherein the first patterned conductive layer has a first plurality of conductive portions, each conductive portion of the first plurality of conductive portions being in contact with a corresponding conductive via of the first plurality of conductive vias and a corresponding conductive via of the second plurality of conductive vias, wherein immediately adjacent edges of immediately adjacent conductive portions of the first patterned conductive layer are parallel to each other;

grinding the bottom surface of the semiconductor layer to expose each of the first and second plurality of conductive vias; and forming a second patterned conductive layer over the bottom surface of the semiconductor layer and over the first and second plurality of conductive vias at the bottom surface of the semiconductor layer, wherein the semiconductor layer and the first and second plurality of conductive vias are between the first patterned conductive layer and the second patterned conductive layer, wherein the second patterned conductive layer has a second plurality of conductive portions, each conductive portion of the second plurality of conductive portions being in contact with a corresponding conductive via of the first plurality of conductive vias and a corresponding conductive via of the second plurality of conductive vias, wherein immediately adjacent edges of immediately adjacent conductive portions of the second patterned conductive layer are parallel to each other, and wherein the first patterned conductive layer, the first plurality of conductive vias, the second plurality of conductive vias, and the second patterned conductive layer form a toroidal inductor coil.

20. The method of claim 19, wherein the second circular pattern surrounds at least 90% of the first circular pattern.

* * * * *